United States Patent
Unno et al.

(10) Patent No.: US 6,303,471 B1
(45) Date of Patent: Oct. 16, 2001

(54) METHOD OF MANUFACTURING SEMICONDUCTOR DEVICE HAVING REINFORCING MEMBER AND METHOD OF MANUFACTURING IC CARD USING THE DEVICE

(75) Inventors: Hideyuki Unno; Manabu Itsumi, both of Kanagawa; Shin-ichi Ohfuji, Tokyo; Masahiko Maeda, Kanagawa, all of (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/416,820

(22) Filed: Oct. 12, 1999

(30) Foreign Application Priority Data

Oct. 14, 1998 (JP) ................................. 10-292047

(51) Int. Cl.⁷ ..................... H01L 21/301; H01L 21/46; H01L 21/78; H01L 21/30; B26D 7/00
(52) U.S. Cl. ..................... 438/464; 438/458; 438/459; 438/977; 83/167
(58) Field of Search ............... 438/15, 458, 459, 438/464, 977, 462; 83/167

(56) References Cited

U.S. PATENT DOCUMENTS

| | | | |
|---|---|---|---|
| 4,908,328 | * 3/1990 | Hu et al. | 437/63 |
| 5,284,803 | * 2/1994 | Haisma et al. | 437/225 |
| 5,445,692 | * 8/1995 | Nitta | 156/87 |
| 5,654,226 | * 8/1997 | Temple et al. | 438/458 |
| 5,851,845 | * 12/1998 | Wood et al. | 438/15 |
| 5,918,113 | * 6/1999 | Higashi et al. | 438/119 |
| 5,994,205 | * 11/1999 | Yamamoto et al. | 438/464 |
| 6,013,534 | * 1/2000 | Mountain | 438/15 |
| 6,077,757 | * 6/2000 | Mizuno et al. | 438/465 |
| 6,136,668 | * 10/2000 | Tamaki et al. | 438/462 |

FOREIGN PATENT DOCUMENTS

| | | | |
|---|---|---|---|
| 355075236A | * | 6/1980 | (JP) . |
| 363094656A | * | 4/1988 | (JP) . |
| 3-158296 | | 7/1991 | (JP) . |
| 04225261 A | * | 8/1992 | (JP) . |
| 5-95046 | | 4/1993 | (JP) . |
| 8-324166 | | 12/1996 | (JP) . |
| 09263082 | * | 7/1997 | (JP) . |
| 09263082 A | * | 10/1997 | (JP) . |
| 9-263082 | | 10/1997 | (JP) . |
| 10-138671 | | 5/1998 | (JP) . |

* cited by examiner

*Primary Examiner*—John F. Niebling
*Assistant Examiner*—Viktor Simkovic
(74) *Attorney, Agent, or Firm*—Blakely Sokoloff Taylor & Zafman

(57) ABSTRACT

After a reinforcing plate is bonded to the lower surface of a semiconductor substrate having a major surface on which integrated circuits are formed, the reinforcing plate is cut in units of integrated circuit chips. A reinforcing member is formed from the reinforcing plate bonded to the lower surface of each integrated circuit chip.

6 Claims, 4 Drawing Sheets

METHOD OF MANUFACTURING SEMICONDUCTOR DEVICE HAVING REINFORCING MEMBER AND METHOD OF MANUFACTURING IC CARD USING THE DEVICE

BACKGROUND OF THE INVENTION

The present invention relates to a method of manufacturing a semiconductor device having a reinforcing member and a method of manufacturing an IC card or smart card using the device and, more particularly, to a method of manufacturing a semiconductor device having a reinforcing member which is bonded to the lower surface of an IC chip and a method of manufacturing an IC card using the device.

For example, a telephone card conventionally used for a public telephone generally uses a magnetic card. However, a magnetic card stores only a small amount of information and cannot cope with various new services. Hence, use of an IC card has been examined.

An IC card currently under development has a structure as shown in FIG. 5. An integrated circuit chip (to be referred to as an IC chip hereinafter) 6 is mounted on an IC card substrate 10 by the flip chip bonding. An electrode 6a for transmitting/receiving a signal to/from an external device is formed on the lower surface of the IC card substrate 10. The structure on a bump 8 side where an integrated circuit is formed is encapsulated with an underfill resin 9 to construct a module. This module is mounted in a card main body comprised of card bases 11, 12, and 13, so an IC card 14 is formed as a whole.

In an IC card, an IC chip storing various data is buried in a resin card. Additionally, an electrode or coil connected to the buried IC chip is formed on the card surface. The IC card has a function of allowing a data read/write from/into an external device via an electrode formed on the card surface in a contact or non-contact state. The IC card having this structure is highly secure because data is converted into an electrical signal and stored in the internal IC chip. Also, a larger quantity of information can be stored and held. These advantages cannot be attained by a magnetic card.

Many IC cards have card bases formed from a plastic material such as PET (polyethylene terephthalate) or vinyl chloride. The IC chip incorporated in the IC card is buried in the card bases and protected from external humidity.

Many IC cards have a thickness of about 0.76 mm in consideration of portability. An IC-card-type telephone card that NTT (Nippon Telegraph and Telephone Corp.) is planning to issue is expected to have a thickness of about 0.5 mm. A 0.25-mm thick IC card thinner than the 0.5-mm thick card has also been under development.

As described above, the thickness of IC cards tends to be smaller year by year. As IC cards become thin, IC chips incorporated in the IC cards must also be thinner. For, e.g., a 0.76-mm thick IC card, the incorporated IC chip has a thickness of about 0.2 to 0.25 mm. For a 0.25-mm thick IC card, the IC chip must also be as thin as 0.05 mm.

However, when IC chips become thin, wafers or IC chips may break during the process of manufacturing IC chips in a wafer state or the process of mounting an IC chip cut from a wafer, so the wafers or IC chips are unusable at high probability. Hence, as IC chips become thin, the yield in the IC chip mounting process becomes low. In addition, since thin wafers or IC chips are processed, they must be carefully handled in various operations during the IC chip manufacturing and mounting processes, resulting in low operation efficiency and low productivity.

When IC chips are thin, the durability of IC cards readily degrades. As far as a card incorporating a thin IC chip is thick, the card cannot be easily intentionally bent, and no stress is applied to the IC chip in the IC card. However, an IC chip is made thin in order to reduce the thickness of an IC card. A thin IC card itself readily bends, and bending stress is easily applied to the IC chip. An IC chip easily bends as it becomes thinner. In comparison between silicon used for an IC chip and a polymer material such as PET used for a card base, silicon cannot easily bend, and the IC chip readily breaks.

To improve the durability of the thin IC cards, various measures have been conventionally taken to protect thin-film IC chips in IC cards. For example, in a technique disclosed in Japanese Patent Laid-Open No. 3-158296, a structure has been proposed, in which a reinforcing member is attached to an IC chip, and the IC chip is fixed on the mounting substrate through the reinforcing member. In a technique disclosed in Japanese Patent Laid-Open No. 8-324166 as well, an IC module structure has been proposed, in which a reinforcing member is attached in advance to a surface different from the terminal surface of an IC chip.

To attach a reinforcing member to an IC chip, conventionally, a reinforcing member having the same size as that of a divided IC chip is bonded to each of the divided IC chips. However, this method increases the process time and cost. Japanese Patent Laid-Open No. 9-263082 discloses a method of shortening the reinforcing member bonding time.

In the technique disclosed in Japanese Patent Laid-Open No. 9-263082, after a wafer on which IC chips are formed is divided into chips, the divided chips are fixed on a transfer sheet while maintaining the wafer shape. Reinforcing members arrayed and divided in advance as in chips are fixed on another transfer sheet. The two transfer sheets are overlaid and bonded. According to this method, since the reinforcing members can be simultaneously bonded to a plurality of IC chips, the bonding time can be shortened. In mounting, since an IC chip to which a reinforcing member has already been attached is used, even the thin-film chip can be easily handled in the mounting process.

However, in the method disclosed in Japanese Patent Laid-Open No. 9-263082, positioning is necessary when the transfer sheets are overlaid. If positioning fails, many IC chips become defective at once to result in large loss, which suffers a new problem. For accurate positioning, an overlay apparatus with a new positioning mechanism must be used in addition to a conventional mounting apparatus, resulting in an increase in facility cost.

SUMMARY OF THE INVENTION

It is a principal object of the present invention to manufacture an IC chip with a reinforcing member resistant to break due to an external force or an IC card incorporating this IC chip with the reinforcing member more easily than the prior art.

It is anther object of the present invention to manufacture an IC chip with a reinforcing member or an IC card incorporating this IC chip with the reinforcing member without increasing cost.

In order to achieve the above objects, according to an aspect of the present invention, there is provided a method of manufacturing a semiconductor device having a reinforcing member, comprising the steps of forming a plurality of integrated circuits on a major surface of a semiconductor substrate, grinding a lower surface of the semiconductor substrate having the integrated circuits to thin the semiconductor substrate, bonding, to the lower surface of the thin semiconductor substrate, a reinforcing plate which covers an entire region of the lower surface of the semiconductor substrate and increases the mechanical strength of the semiconductor substrate, dividing the thin semiconductor substrate into a plurality of integrated circuit chips, and dividing the reinforcing plate in correspondence with the integrated circuit chips, wherein the reinforcing member formed from the reinforcing plate is formed on a lower surface of each of the integrated circuit chips.

According to the present invention, the reinforcing plate is bonded to the semiconductor substrate and then divided.

According to another aspect of the present invention, there is provided a method of manufacturing an IC card, comprising the step of forming a plurality of integrated circuits on a major surface of a semiconductor substrate, grinding a lower surface of the semiconductor substrate having the integrated circuits to thin the semiconductor substrate, bonding, to the lower surface of the thin semiconductor substrate, a reinforcing plate which covers an entire region of the lower surface of the semiconductor substrate and increases the mechanical strength of the semiconductor substrate, dividing the thin semiconductor substrate into a plurality of integrated circuit chips, dividing the reinforcing plate in correspondence with the integrated circuit chips, and mounting, in an IC card, an integrated circuit chip with a reinforcing member, in which the reinforcing member formed from the reinforcing plate is formed on a lower surface of the integrated circuit chip obtained by dividing the reinforcing plate.

According to the present invention, the reinforcing plate is bonded to the semiconductor substrate and then divided. The integrated circuit chip with the divided reinforcing member is incorporated into the IC card.

DESCRIPTION OF THE PREFERRED EMBODIMENTS

The embodiments of the present invention will be described below in detail with reference to the accompanying drawings.

First Embodiment

A method of manufacturing a semiconductor device having a reinforcing member according to the first embodiment of the present invention will be described.

Figure 1A:
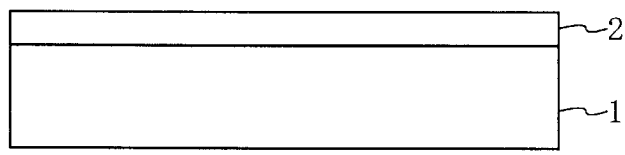
FIGS. 1A to 1F are views for explaining a method of manufacturing a semiconductor device having a reinforcing member according to an embodiment of the present invention.
Figure 1B:
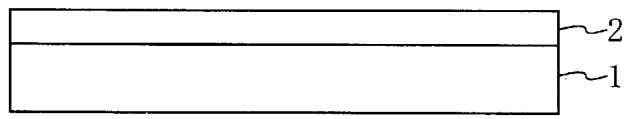

First, as shown in FIG. 1A, integrated circuits (ICs) 2 are formed on the major surface side of a wafer 1 formed from a semiconductor such as silicon. Next, as shown in FIG. 1B, the wafer 1 is made thin by grinding, polishing, or etching the wafer from a surface opposite to the surface having the integrated circuits 2, i.e., from the lower surface side. In thinning the wafer 1, the thickness of the wafer is determined in accordance with the thickness of a completed IC card or smart card. For example, when the thickness of a completed IC card is 0.76 mm, the wafer 1 is thinned to a thickness of 0.2 to 0.25 mm. When the thickness of the IC card is 0.25 mm, the wafer is thinned to a thickness of about 0.05 mm. Even for an IC card having a thickness of 0.76 mm, the wafer 1 may be further thinned to about 0.05 mm. In thinning the wafer 1, a protective tape or the like is preferably temporarily bonded to the surface having the integrated circuits 2 to prevent damage to the integrated circuits 2 although this process is not illustrated.

Figure 1C:
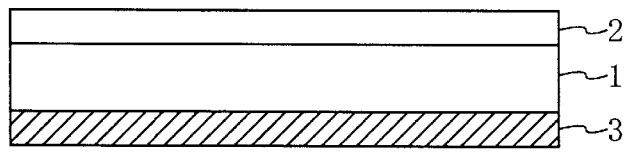

After the wafer 1 is thinned, a reinforcing plate 3 is bonded to the lower surface of the thin wafer 1 using an adhesive, as shown in FIG. 1C. As the adhesive used for bonding, various materials such as epoxy, silicone, rubber, and acrylic materials can be used. A plurality of bonding methods can be used. For example, a method such as cold gluing or thermosetting can be used in accordance with the manufacturing conditions. Generally, the thickness of the adhesive is about 10 to 100 $\mu$m. Alternatively, a sheet- or plate-like adhesive may be bonded to the lower surface of the wafer 1. In this case, the reinforcing plate 3 is bonded to the plate-like adhesive and heated to bond the reinforcing plate 3 to the wafer 1.

As the reinforcing plate 3 to be bonded to the lower surface of the wafer 1 using the adhesive, a metal plate formed from a Kovar metal (Fe—Ni—Co-based alloy) or stainless steel such as 42-alloy can be used. As the reinforcing plate 3, a metal plate formed from a metal such as copper, tungsten, molybdenum, or aluminum or an alloy thereof may be used.

Instead of a metal plate, a polymer material such as a plastic plate may be used. For example, even when a plate member of polyimide, polyethylene terephethalate (PET), polyvinyl chloride, polypropylene, polytetrafluoroethylene, or acrylonitrile butadiene styrene polymer (ABS) is used, a sufficient reinforcing effect can be obtained. A plate formed from such a polymer material and one of the above-described metals may be used as the reinforcing plate. When a plastic plate which passes light to some extent is used as the reinforcing plate, the reinforcing plate can be bonded to the lower surface of the wafer 1 using a UV curing adhesive.

The thickness of the reinforcing plate is appropriately changed in accordance with the thickness of the completed IC card or the thickness of a substrate on which the IC chip is mounted. For an IC card with a substrate thickness of about 0.25 to 0.76 mm, the thickness of the reinforcing plate is set within the range of 20 to 100 $\mu$m. When the reinforcing member formed from the reinforcing plate is bonded, the apparent thickness of the IC chip becomes larger than the original thickness by 30 to 200 $\mu$m or more. Since the thickness increases due to the reinforcing member, the type and thickness of the reinforcing plate must be selected in consideration of the thickness of the IC card and the final thickness of the IC chip.

Figure 1D:
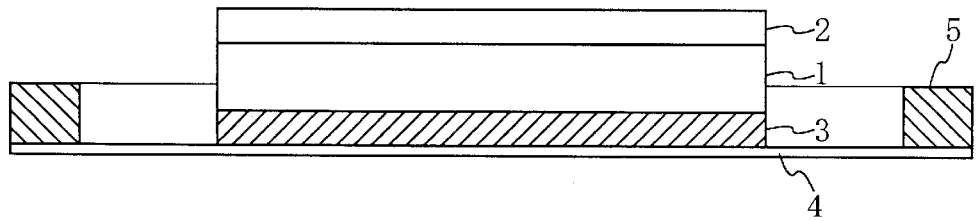
Figure 1E:
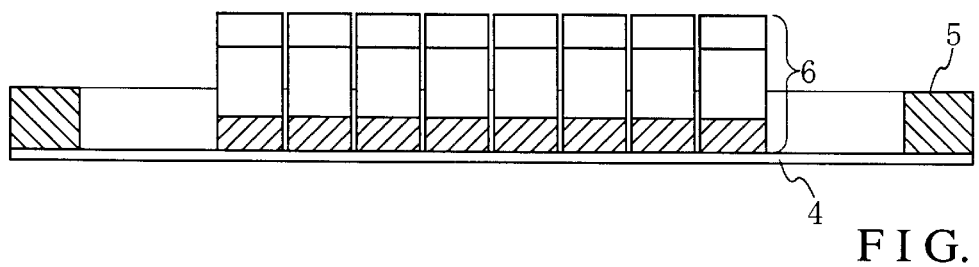
Figure 2A:
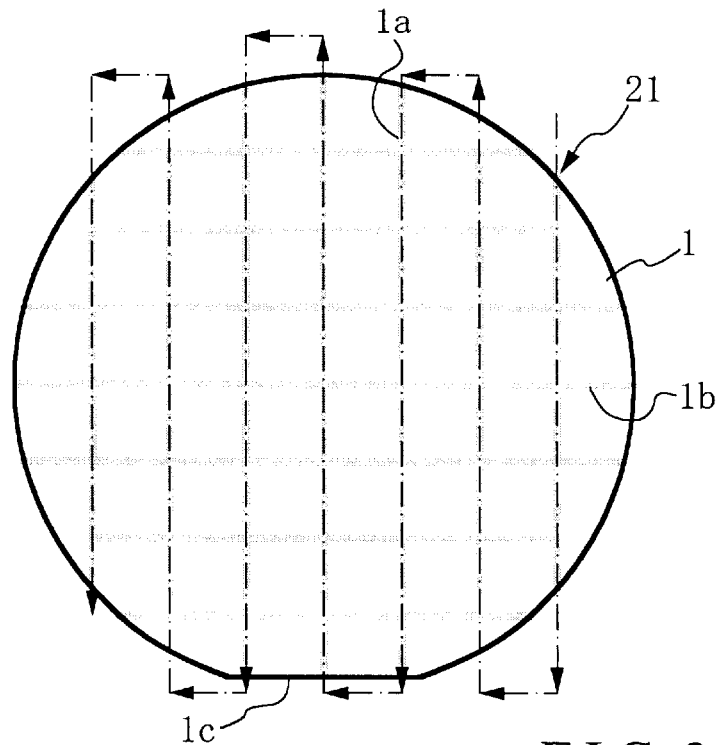
FIGS. 2A and 2B are plan views for explaining the dicing method in FIG. 1E.
Figure 2B:
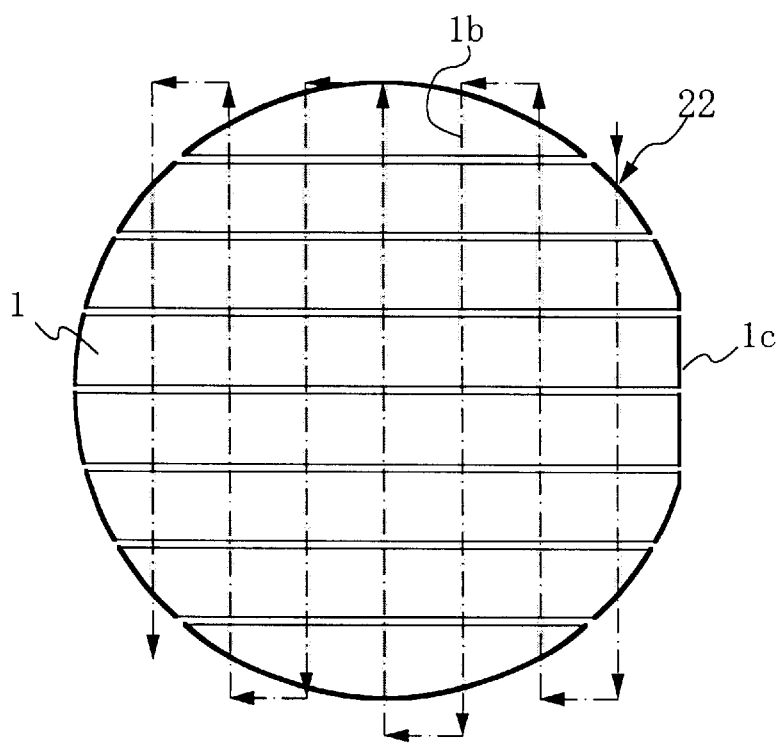

When the reinforcing plate 3 is bonded to the lower surface of the wafer 1, the wafer 1 having the reinforcing plate 3 is bonded to a dicing tape (sheet) 4 stretched on an annular carrier 5, as shown in FIG. 1D. After the wafer is bonded to the dicing tape 4, the wafer 1 is diced, as shown in FIG. 1E. Dicing is a technique of forming cuts in a matrix in the wafer and dividing the wafer 1 into chips (dice). For dicing an IC using a silicon substrate, generally, the wafer 1 is cut into dices by cutting using, as a cutting edge, a diamond blade formed by hardening abrasive grains of diamond or the like with a binder, as shown in FIGS. 2A and 2B. More specifically, a diamond blade attached to a spindle rotating at a high speed is rotated at, e.g., 30,000 to 40,000 rpm. The wafer 1 is cut along scribing lines 1a and 1b by this diamond blade rotating at a high speed. In cutting, the diamond blade rotating at a high speed is fixed and cuts the wafer 1 while moving the wafer 1. First, as shown in FIG. 2A, the wafer 1 is set such that an orientation flat 1c is perpendicular to the rotational direction of the diamond blade (not shown). The wafer 1 is moved to locate the diamond blade at a point 21. The diamond blade rotating at a high speed is cut into the wafer 1. The wafer 1 is moved to move the diamond blade in the directions indicated by the arrows along the alternate long and short dashed lines. The wafer 1 is cut along the scribing lines 1a perpendicular to the orientation flat 1c. Next, as shown in FIG. 2B, the wafer 1 is rotated through 90° and set such that the orientation flat 1c is parallel to the rotational direction of the diamond blade (not shown). The wafer 1 is moved to locate the diamond blade at a point 22. The diamond blade rotating at a high speed is cut into the wafer 1. The wafer 1 is moved to move the diamond blade in the directions indicated by the arrows along the alternate long and short dashed lines. The wafer 1 is cut along the scribing lines 1b parallel to the orientation flat 1c. With this process, the wafer 1 bonded to the dicing tape 4 is divided into IC chips 6.

However, it is difficult to cut a metal plate using the diamond blade. Hence, when a metal plate is used as the reinforcing plate 3, the wafer 1 is diced by any one of the following methods.

As the first method, after only the wafer 1 is cut using the diamond blade, the metal plate is cut using a CBN (Cubic Boron Nitride) blade formed by hardening CBN abrasive grains, thereby dicing the wafer 1 bonded to the reinforcing plate 3.

As the second method, a CBN blade with high hardness is used from the beginning to simultaneously dice the wafer 1 and reinforcing plate 3.

Figure 1F:
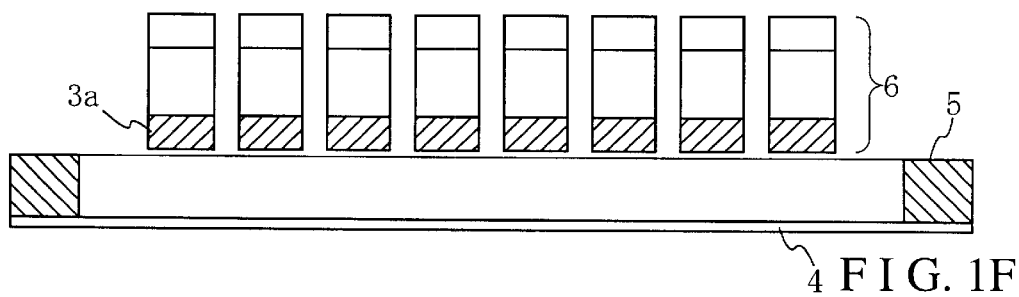

When the wafer 1 bonded to the reinforcing plate 3 is diced, the IC chips 6 with reinforcing members 3a formed from the reinforcing plate are removed from the dicing tape 4, as shown in FIG. 1F. The reinforcing members 3a formed from the reinforcing plate are formed on the lower surfaces of the IC chips 6. For this reason, the risk of breaking the IC chips 6 in removing them from the dicing tape 4 is decreased.

Figure 4:
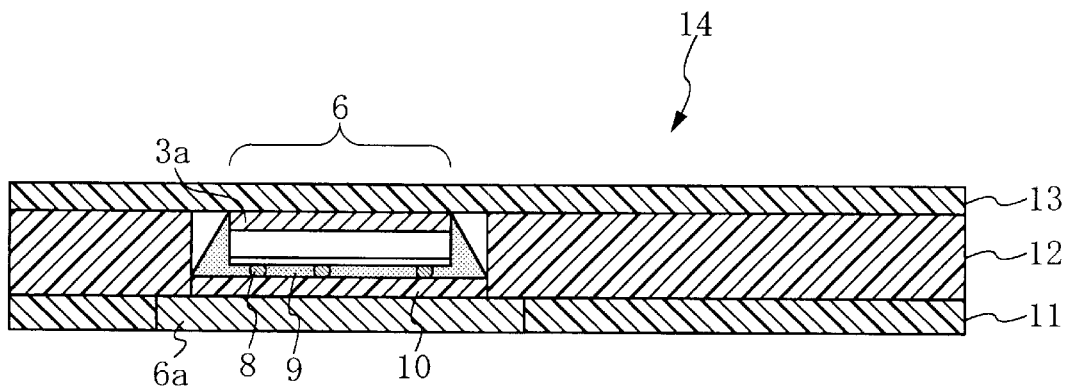
FIG. 4 is a sectional view showing the structure of an IC card manufactured by the present invention.
Figure 5:
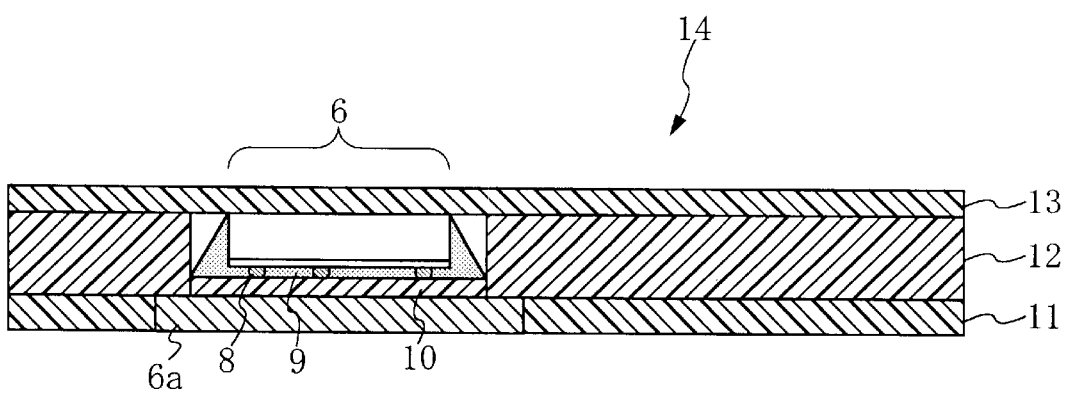
FIG. 5 is a sectional view showing the structure of a conventional IC card.

After the individual IC chips 6 are formed, each IC chip 6 having the reinforcing member 3a is mounted on an IC card substrate 10 by flip chip bonding using a bump 8, as shown in FIG. 4. At the process of mounting as well, since the IC chip 6 has the reinforcing member 3a, the risk of break during mounting is decreased. After the IC chip 6 is mounted on the IC card substrate 10 having, on its lower surface, an electrode 6a for transmitting/receiving a signal to/from an external device, the structure on the integrated circuit formation side is encapsulated with an underfill resin 9 to form a module. The resultant module is mounted in a card main body formed from card bases 11, 12, and 13 to complete an IC card 14.

In this embodiment, the reinforcing plate 3 side is bonded to the dicing tape 4. However, the surface of the wafer 1, where the integrated circuits 2 are formed, may be bonded to the dicing tape 4. In this case, cuts are formed on the lower surface of the reinforcing plate 3 to dice the wafer. Alternatively, cuts may be formed from the wafer side to the boundary between the wafer and the reinforcing plate using the diamond blade. After this, the cuts may be formed from the reinforcing plate side using the CBN blade to dice the wafer.

Second Embodiment

A method of manufacturing a semiconductor device having a reinforcing member according to the second embodiment of the present invention will be described with reference to FIGS. 3A to 3G. The same reference numerals as in FIGS. 1A to 1F denote the same or similar parts in FIGS. 3A to 3G.

Figure 3A:
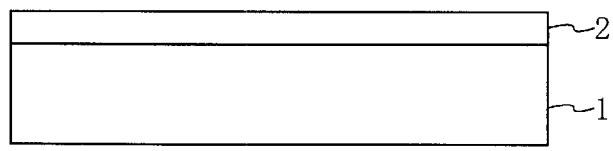
FIGS. 3A to 3G are views for explaining a method of manufacturing a semiconductor device having a reinforcing member according to another embodiment of the present invention.
Figure 3B:
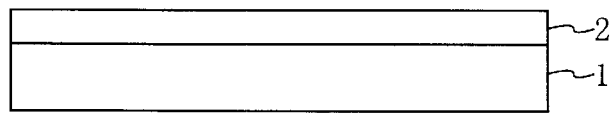

First, as shown in FIG. 3A, integrated circuits 2 are formed on a wafer 1 in units of chips. Next, as shown in FIG. 3B, the surface on the opposite side of the surface having the integrated circuits 2 is ground, polished, or etched to thin the wafer 1. The process until thinning the wafer 1 is the same as in the first embodiment. In thinning the wafer 1, a tape or the like is temporarily bonded to the surface having the integrated circuits 2 to prevent damage to the integrated circuits 2 although this process is not illustrated.

Figure 3C:
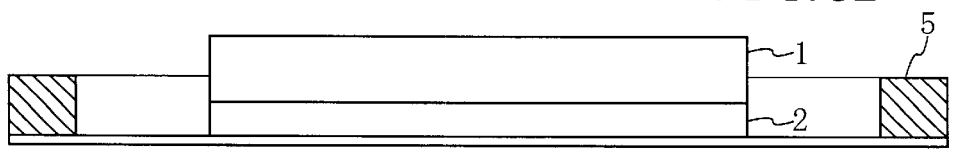
Figure 3D:
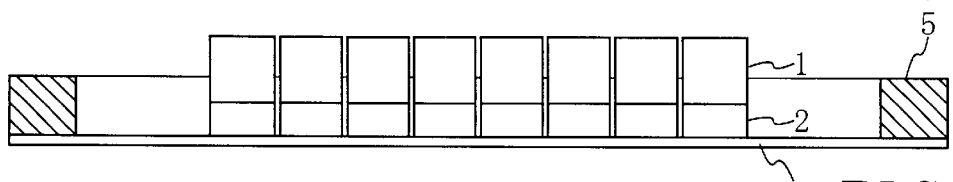

After the wafer 1 is thinned, the wafer 1 is fixed on a dicing tape 4 stretched on an annular carrier 5, as shown in FIG. 3C, such that the surface having the integrated circuits 2 is bonded to the dicing tape 4. Next, as shown in FIG. 3D, the wafer 1 is cut from the lower surface to dice the wafer into IC chips. For this dicing, cutting using a diamond blade is used, as described with reference to FIGS. 2A and 2B. When the wafer 1 is to be cut from the lower surface, the surface having the integrated circuits 2 cannot be seen, and the scribing lines cannot be easily confirmed. However, when coordinate points of the chip array in the wafer 1 are measured in advance, the wafer 1 can be diced from the lower surface although the surface having the integrated circuits 2 cannot be seen. A silicon wafer passes infrared rays. Hence, a dicing apparatus having an infrared microscope can dice the wafer while observing the integrated circuit on the upper surface side or scribing lines on the basis of the infrared image transmitted through the wafer.

Figure 3E:
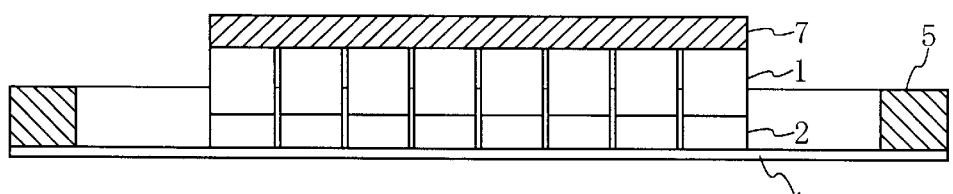

After the wafer 1 is cut, a reinforcing plate 7 formed from a single plate is bonded to the entire region of the lower surface (the surface without the integrated circuits 2) of the cut wafer 1, as shown in FIG. 3E. To bond the reinforcing plate 7, an adhesive sheet is bonded on the lower surface of the cut wafer 1, and the reinforcing plate 7 is overlaid on the adhesive sheet and bonded. Alternatively, an adhesive may be applied to the reinforcing plate 7 in advance. The reinforcing plate 7 with the adhesive may be bonded to the lower surface of the wafer 1.

When a polyimide material which exhibits adhesion when heated to about 300° and pressed is used for the reinforcing plate 7, the reinforcing plate formed from polyimide can be bonded to the lower surface of the wafer without preparing any adhesive.

The reinforcing plate 7 formed from a single plate and having an integrated structure need not always have the same shape as that of the wafer 1 as long as the reinforcing plate 7 has a size the cover all chips of the wafer 1 cut on the dicing tape 4. The reinforcing plate 7 bonded in FIG. 3E may have an area larger than the wafer 1.

Figure 3F:
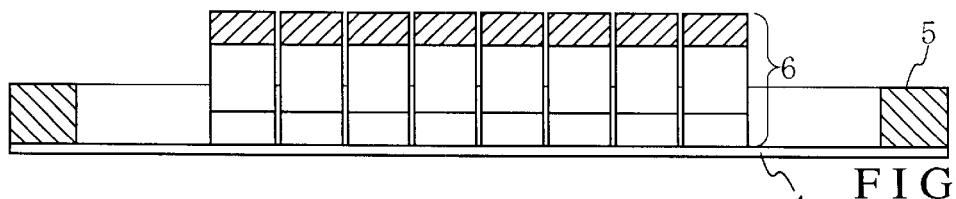

After the reinforcing plate 7 having an integrated structure is bonded, the reinforcing plate 7 is cut, as shown in FIG. 3F. For this cutting, cuts are formed into the reinforcing plate 7 using a CBN blade along the scribing lines of the wafer 1 which has already been cut. At this time, when the depth of cut of the CBN blade is adjusted such that the CBN blade does not reach the wafer 1 under the reinforcing plate 7, damage to the end faces of the individual chips which have already been divided can be prevented. If it is difficult to adjust the depth of cut of the blade, a CBN blade having a width smaller than that of the diamond blade used to cut the wafer 1 is used to cut the reinforcing plate 7, thereby preventing damage to the end faces of the individual chips which have already been divided.

Figure 3G:
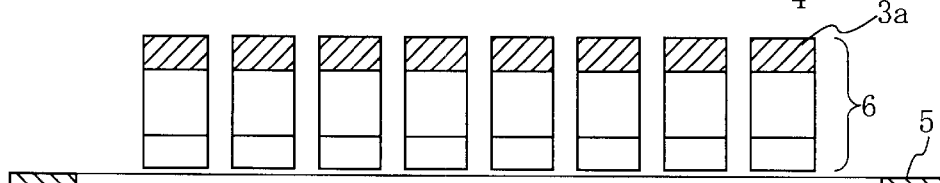

After the reinforcing plate 7 is cut, IC chips 6 having reinforcing members 3a on their lower surfaces are peeled from the dicing tape 4, as shown in FIG. 3G. As shown in FIG. 4, each peeled IC chip 6 is mounted on an IC card substrate 10 by flip chip bonding using a bump 8. The IC card substrate 10 has, on its lower surface, an electrode 6a for transmitting/receiving a signal to/from an external device. The structure on the mounting surface side is encapsulated with an underfill resin 9 to form a module. This module is mounted in a card main body formed from card bases 11, 12, and 13 to complete an IC card 14.

As described above, in this embodiment as well, the IC chip 6 has the reinforcing member 3a on the lower surface. Hence, the risk of breaking the IC chip 6 in removing it from the dicing tape 4 is decreased. In the process of mounting as well, since the IC chip 6 has the reinforcing member 3a the risk of break during mounting is decreased.

In this embodiment, the wafer is cut before the reinforcing plate is bonded. For this reason, the wafer can be cut without changing the conventional dicing conditions. In addition, break or flaws on the cutting surface of the wafer, which may damage the chip, can be suppressed, as compared to a case wherein the wafer is cut after the reinforcing plate is bonded.

As has been described above, according to the present invention, the method of manufacturing a semiconductor device having a reinforcing member, comprises the steps of forming a plurality of integrated circuits on a major surface of a semiconductor substrate, grinding a lower surface of the semiconductor substrate having the integrated circuits to thin the semiconductor substrate, bonding, to the lower surface of the thin semiconductor substrate, a reinforcing plate which covers an entire region of the lower surface of the semiconductor substrate and increases the mechanical strength of the semiconductor substrate, dividing the thin semiconductor substrate into a plurality of integrated circuit chips, and dividing the reinforcing plate in correspondence with the integrated circuit chips. The reinforcing member formed from the reinforcing plate is formed on a lower surface of each of the integrated circuit chips.

According to this invention, since the reinforcing plate is divided after it is bonded to the semiconductor substrate, the reinforcing plate for protecting the chip from stress or impact can be easily attached to the chip. In addition, since the reinforcing member need not be positioned in units of chips, unlike the prior art, semiconductor devices having reinforcing members can be manufactured at a high yield.

According to another embodiment of the present invention, the method of manufacturing an IC card, comprises the step of forming a plurality of integrated circuits on a major surface of a semiconductor substrate, grinding a lower surface of the semiconductor substrate having the integrated circuits to thin the semiconductor substrate, bonding, to the lower surface of the thin semiconductor substrate, a reinforcing plate which covers an entire region of the lower surface of the semiconductor substrate and increases the mechanical strength of the semiconductor substrate, dividing the thin semiconductor substrate into a plurality of integrated circuit chips, dividing the reinforcing plate in correspondence with the integrated circuit chips, and mounting, in an IC card, an integrated circuit chip with a reinforcing member, in which the reinforcing member formed from the reinforcing plate is formed on a lower surface of the integrated circuit chip obtained by dividing the reinforcing plate.

According to this invention, the reinforcing plate is divided after it is bonded to the semiconductor substrate, and the integrated circuit chip having the reinforcing member is mounted in the IC card. Hence, the reinforcing plate for protecting the chip from stress or impact can be easily attached to the chip, and the chip can be easily mounted in the IC card. In addition, since the reinforcing member need not be positioned in units of chips, unlike the prior art, semiconductor devices having reinforcing members of IC cards can be manufactured at a high yield.

What is claimed is:

1. A method of manufacturing a semiconductor device having a reinforcing member, comprising:

forming a plurality of integrated circuits on a major surface of a semiconductor substrate;

grinding a lower surface of said semiconductor substrate having said integrated circuits to thin said semiconductor substrate;

bonding, to the lower surface of said thin semiconductor substrate, a reinforcing plate which covers an entire region of the lower surface of said semiconductor substrate and increases the mechanical strength of said semiconductor substrate, wherein said reinforcing plate comprises a plate member formed from a metal and a polymer material;

dividing said thin semiconductor substrate into a plurality of integrated circuit chips; and dividing said reinforcing plate in correspondence with said integrated circuit chips, wherein said reinforcing member formed from said reinforcing plate is formed on a lower surface of each said integrated circuit chips.

2. A method of manufacturing a semiconductor device having a reinforcing member, comprising:

forming a plurality of integrated circuits on a major surface of a semiconductor substrate;

grinding a lower surface of said semiconductor substrate having said integrated circuits to thin said semiconductor substrate;

bonding, to the lower surface of said thin semiconductor substrate, a reinforcing plate which covers an entire region of the lower surface of said semiconductor substrate and increases the mechanical strength of said semiconductor substrate, wherein said reinforcing plate comprises a plate member formed from a polymer material;

dividing said thin semiconductor substrate into a plurality of integrated circuit chips; and dividing said reinforcing plate in correspondence with said integrated circuit chips, wherein said reinforcing member formed from said reinforcing plate is formed on a lower surface of each of said integrated circuit chips.

3. A method of manufacturing an IC card, comprising:

forming a plurality of integrated circuits on a major surface of a semiconductor substrate;

grinding a lower surface of said semiconductor substrate having said integrated circuits to thin said semiconductor substrate;

bonding, to the lower surface of said thin semiconductor substrate, a reinforcing plate which covers an entire region of the lower surface of said semiconductor substrate and increases the mechanical strength of said semiconductor substrate, wherein said reinforcing plate comprises a plate member formed from a metal and a polymer material;

dividing said thin semiconductor substrate into a plurality of integrated circuit chips;

dividing said reinforcing plate in correspondence with said integrated circuit chips; and mounting, in an IC card, an integrated circuit chip with a reinforcing member, in which said reinforcing member formed from said reinforcing plate is formed on a lower surface of said integrated circuit chip obtained by dividing said reinforcing plate.

4. A method according to claim 2, wherein said reinforcing plate comprises a plate member formed from a material selected from the group consisting of polyimide, polyethylene terephethalate, polyvinyl chloride, polypropylene, polytetrafluoroethylene, and acrylonitrile butadiene styrene polymer.

5. A method of manufacturing a semiconductor device having a reinforcing member, comprising:

forming a plurality of integrated circuits on a major surface of a semiconductor substrate;

grinding a lower surface of said semiconductor substrate having said integrated circuits to thin said semiconductor substrate;

bonding the major surface of said semiconductor substrate, where said integrated circuits are formed, to a sheet having an area larger than said semiconductor substrate;

dividing said thin semiconductor substrate into a plurality of integrated circuit chips; and bonding, to the lower surface of said thin semiconductor substrate, a reinforcing plate which covers an entire region of the lower surface of said semiconductor substrate and increases the mechanical strength of said semiconductor substrate, wherein bonding the reinforcing plate is done while said integrated circuit chips are bonded to said sheet;

dividing the reinforcing plate bonded to the lower surface of said semiconductor substrate divided into said plurality of integrated circuit chips in correspondence with said integrated circuit chips; and after said reinforcing plate bonded to the lower surface of said semiconductor substrate is divided, removing said integrated circuit chips from said sheet.

6. A method of manufacturing an IC card, comprising:

forming a plurality of integrated circuits on a major surface of a semiconductor substrate;

grinding a lower surface of said semiconductor substrate having said integrated circuits to thin said semiconductor substrate;

bonding the major surface of said semiconductor substrate, where said integrated circuits are formed, to a sheet having an area larger than said semiconductor substrate;

dividing said thin semiconductor substrate into a plurality of integrated circuit chips;

bonding, to the lower surface of said thin semiconductor substrate, a reinforcing plate which covers an entire region of the lower surface of said semiconductor substrate and increases the mechanical strength of said semiconductor substrate, wherein bonding the reinforcing plate is done while said integrated circuit chips are bonded to said sheet;

dividing the reinforcing plate bonded to the lower surface of said semiconductor substrate divided into said plurality of integrated circuit chips in correspondence with said integrated circuit chips;

after said reinforcing plate bonded to the lower surface of said semiconductor substrate is divided, removing said integrated circuit chips from said sheet; and mounting, in an IC card, an integrated circuit chip with a reinforcing member, in which said reinforcing member formed from said reinforcing plate is formed on a lower surface of said integrated circuit chip obtained by dividing said reinforcing plate.

* * * * *